United States Patent
Jang

(10) Patent No.: US 11,839,081 B2
(45) Date of Patent: Dec. 5, 2023

(54) SEMICONDUCTOR MEMORY DEVICE INCLUDING A PLURALITY OF MEMORY BLOCKS AND METHOD OF MANUFACTURING THE SAME

(71) Applicant: SK hynix Inc., Icheon-si (KR)

(72) Inventor: Jung Shik Jang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 282 days.

(21) Appl. No.: 17/160,105

(22) Filed: Jan. 27, 2021

(65) Prior Publication Data
US 2022/0085057 A1    Mar. 17, 2022

(30) Foreign Application Priority Data

Sep. 14, 2020   (KR) .................. 10-2020-0117386

(51) Int. Cl.
| | |
|---|---|
| H10B 43/27 | (2023.01) |
| H10B 41/10 | (2023.01) |
| H10B 41/27 | (2023.01) |
| H10B 41/40 | (2023.01) |
| H10B 43/10 | (2023.01) |
| H10B 43/40 | (2023.01) |

(52) U.S. Cl.
CPC ............ *H10B 43/27* (2023.02); *H10B 41/10* (2023.02); *H10B 41/27* (2023.02); *H10B 41/40* (2023.02); *H10B 43/10* (2023.02); *H10B 43/40* (2023.02)

(58) Field of Classification Search
CPC ......... H01L 27/11582; H01L 27/11573; H01L 27/11529; H01L 27/11578; G11C 5/025; G11C 16/0483
See application file for complete search history.

(56) References Cited

U.S. PATENT DOCUMENTS

| | | | | |
|---|---|---|---|---|
| 2015/0318301 | A1* | 11/2015 | Lee | H10B 43/10 |
| | | | | 257/324 |
| 2018/0076215 | A1* | 3/2018 | Nishimura | H10B 43/10 |
| 2018/0130814 | A1* | 5/2018 | Lee | H10B 43/10 |
| 2021/0020657 | A1* | 1/2021 | Song | H10B 41/10 |

FOREIGN PATENT DOCUMENTS

| | | |
|---|---|---|
| KR | 102084725 B1 | 3/2020 |
| KR | 1020210142914 A | 11/2021 |

* cited by examiner

*Primary Examiner* — Mark W Tornow
*Assistant Examiner* — David Paul Sedorook
(74) *Attorney, Agent, or Firm* — WILLIAM PARK & ASSOCIATES LTD.

(57) ABSTRACT

A semiconductor memory device may include a plurality of memory blocks and at least one insulation bridge. The plurality of the memory blocks may be defined by a plurality of slits parallel to each other. The at least one insulation bridge may be formed in at least one slit located on at least one side of a memory block of the plurality of memory blocks to support the adjacent memory blocks.

14 Claims, 11 Drawing Sheets

SEMICONDUCTOR MEMORY DEVICE INCLUDING A PLURALITY OF MEMORY BLOCKS AND METHOD OF MANUFACTURING THE SAME

CROSS-REFERENCES TO RELATED APPLICATION

The present application claims priority under 35 U.S.C. § 119(a) to Korean application number 10-2020-0117386, filed on Sep. 14, 2020, in the Korean Intellectual Property Office, which is incorporated herein by reference in its entirety.

BACKGROUND

1. Technical Field

Various embodiments may generally relate to a semiconductor memory device and a method of manufacturing the same, more particularly to a semiconductor memory device including a plurality of memory blocks and a method of manufacturing the semiconductor memory device.

2. Related Art

In order to meet needs of customers such as good performance, low price, etc., it may be required to increase an integration degree of a semiconductor memory device. Because the integration degree of the semiconductor memory device may be an important factor for determining the price of the semiconductor memory device, the increased integration degree may be necessary.

In a conventional two-dimensional or planar semiconductor memory device, the integration degree may be determined by an area of a unit memory cell so that the integration degree may be greatly influenced by a technology for forming a fine pattern. However, expensive equipment may be required to form the fine pattern. Thus, although the integration degree of the two-dimensional semiconductor memory device may be increased, the integration degree may still be restricted.

In order to overcome the restriction, three-dimensional semiconductor memory devices including three-dimensionally arranged memory cells may be proposed.

The three-dimensional semiconductor device may include stacked memory cells. Thus, an integration density of the memory cell may closely relate to a height of a structure so that an aspect ratio may be increased due to the high integration density.

SUMMARY

In example embodiments of the present disclosure, a semiconductor memory device may include a plurality of memory blocks and an insulation bridge. The plurality of the memory blocks may be defined by a plurality of slits parallel to each other. The insulation bridge may be formed in the slits at both sides of the memory block to support adjacent memory blocks.

In example embodiments of the present disclosure, a semiconductor memory device may include a plurality of memory blocks and at least one bridge. Each of the memory blocks may include a stacked structure. The stacked structure may include an insulation layer and a conductive layer alternately stacked. The at least one bridge may include the insulation layers of the memory block. The at least one bridge may be positioned between the adjacent memory blocks.

In example embodiments, the bridges positioned at both sides of one memory block may correspond to each other. Alternatively, the bridges positioned at both sides of one memory block may not be facing each other.

In example embodiments, numbers of the bridges at spaces between the memory blocks, i.e., the slits may be equal to or different from each other for each slit.

In example embodiments of the present disclosure, a method of manufacturing a semiconductor memory device may include alternately stacking a first insulation layer and a second insulation layer to form a stacked structure. Slits may be formed at the stacked structure to divide the stacked structure into a plurality of memory blocks. A preliminary bridge may be simultaneously formed in each of the slits to partially connect memory blocks of the stacked structure with each other. The second insulation layer of the preliminary bridge exposed through the slit may be selectively removed to form a space. A conductive layer for a word line may be formed in the space of the memory block and the preliminary bridge. The conductive layer for the word line remaining in the space of the preliminary bridge may be removed to form an insulation bridge.

Removing the conductive layer for the word line remaining in the space of the preliminary bridge comprises simultaneously performing a process for removing the conductive layer for the word line remaining on a sidewall and a bottom surface of the slit.

In example embodiments, removing the conductive layer for the word line remaining on the sidewall and the bottom surface of the slit comprises over-etching the conductive layer for the word line remaining on the sidewall of the slit by a width (thickness) greater than a width of the conductive layer for the word line remaining on the sidewall of the slit.

A width of the insulation bridge is determined in accordance with an over-etched amount of the conductive layer for the word line.

A width of the insulation bridge is no more than two times the width of the over-etched conductive layer for the word line in the preliminary bridge or the width of the conductive layer for the word line remaining on the sidewall of the slit.

In example embodiments, removing the conductive layer for the word line in the space of the preliminary bridge may be performed simultaneously with removing the conductive layer for the word line remaining on a sidewall and a bottom surface of the slit.

In example embodiments, removing the conductive layer for the word line remaining on the sidewall and the bottom surface of the slit may include over-etching the remaining conductive layer for the word line by a width (thickness) greater than a width of the remaining conductive layer for the word line.

In example embodiments, a width of the insulation bridge may be determined in accordance with an over-etched amount of the remaining conductive layer for the word line.

In example embodiments, the width of the insulation bridge may be two times a width of the over-etched conductive layer for the word line in the preliminary bridge or the width of the conductive layer for the word line remaining on the sidewall of the slit.

BRIEF DESCRIPTION OF THE DRAWINGS

The above and other aspects, features and advantages of the subject matter of the present disclosure will be more clearly understood from the following detailed description taken in conjunction with the accompanying drawings, in which.

DETAILED DESCRIPTION

Various embodiments of the present invention will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein, but may include deviations in configurations and shapes which do not depart from the spirit and scope of the present invention as defined in the appended claims.

The present invention is described herein with reference to cross-section and/or plan illustrations of idealized embodiments of the present invention. However, embodiments of the present invention should not be construed as limiting the inventive concept. Although a few embodiments of the present invention will be shown and described, it will be appreciated by those of ordinary skill in the art that changes may be made in these embodiments without departing from the principles and spirit of the present invention.

Figure 1:
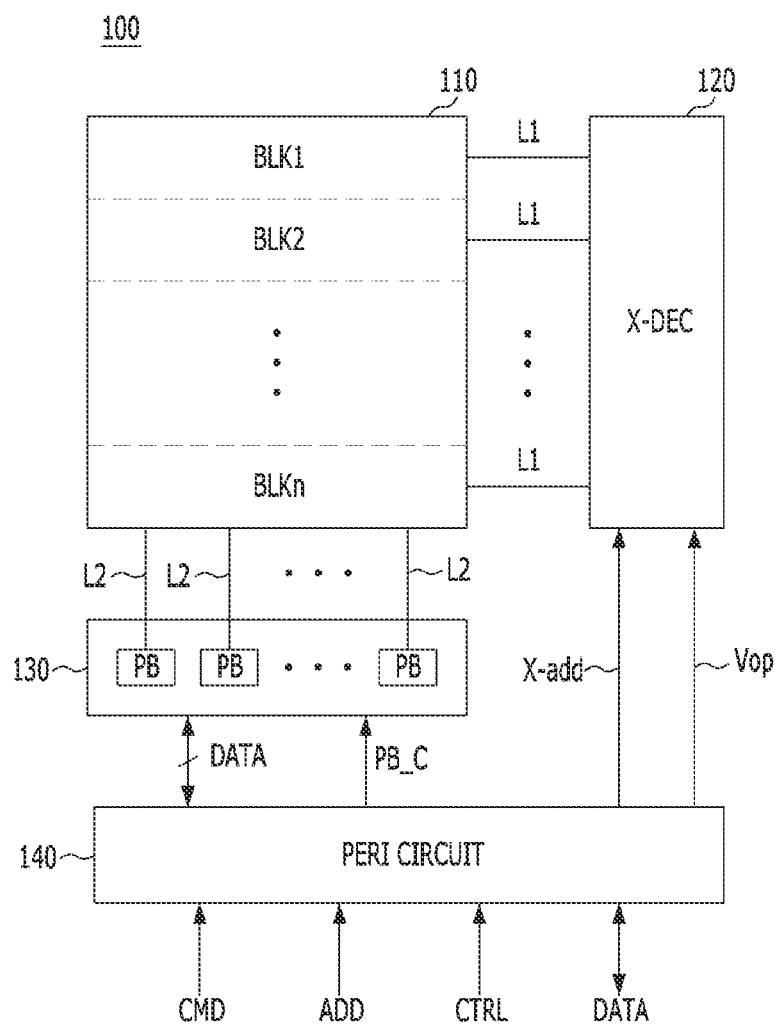
FIG. 1 is a block diagram illustrating a semiconductor memory device in accordance with example embodiments.

FIG. 1 is a block diagram illustrating a semiconductor memory device in accordance with example embodiments.

Referring to FIG. 1, a semiconductor memory device 100 of example embodiments may include a memory cell array 110, a row decoder 120, a page buffer circuit 130 and a peripheral circuit 140.

The memory cell array 110 may include a plurality of memory blocks BLK1~BLKn. Each of the memory blocks BLK1~BLKn may include a plurality of strings and a plurality of memory cells. The memory cell may be accessed by a word line and a bit line. For example, the memory cell may include a non-volatile memory cell configured to maintain stored data regardless of a power supply. However, the memory cell may not be restricted to the non-volatile memory cell.

Hereinafter, the semiconductor memory device of example embodiments may include a vertical NAND flash memory, and may not be restricted to a specific memory type.

The semiconductor memory device 100 may include a plurality of first line structures L1 and a plurality of second line structures L2. Each of the first line structures L1 may include stacked word lines. Each of the second line structures L2 may include a bit line. The first line structure L1 may be a part of the memory cell array 110. The first line structure L1 may be electrically connected with the row decoder (X-DEC) 120. The second line structure L2 may be another part of the memory cell array 110. The second line structure L2 may be electrically connected with the page buffer circuit 130 including a plurality of page buffers PB.

Each of the first line structures L1 may include at least one drain selection line, a plurality of word lines and at least one source selection line. For example, one first line structure L1 may form one memory block BLK. The row decoder 120 may select any one of the memory blocks BLK1~BLKn of the memory cell array 110 based on address information ADD provided from a controller.

The row decoder 120 may receive an operational voltage Vop generated from the peripheral circuit 140. The row decoder 120 may transmit the operational voltage Vop to a selected memory block BLK through the first line structure L1. For example, the operational voltage Vop may include a program voltage, a pass voltage, a read voltage, etc. Although not depicted in the drawings, the row decoder 120 may include a pass switch element configured to provide a selected memory block BLKi~BLKi+n with the operational voltage Vop.

The page buffer circuit 130 may include a plurality of page buffers PB connected to the second line structures L2. The page buffer circuit 130 may receive a page buffer control signal PB_C from the peripheral circuit 140. Further, data DATA may be transmitted between the page buffer circuit 130 and the peripheral circuit 140.

The page buffer circuit 130 may control the second line structure L2 of the memory cell array 110, i.e., the bit line in response to the page buffer control signal PB_C. For example, the page buffer circuit 130 may sense a voltage level of the bit line in the memory cell array 110 in response to the page buffer control signal PB_C to detect data stored in the memory cell. Further, the page buffer circuit 130 may transmit the detected data to the peripheral circuit 140. The page buffer circuit 130 may apply a voltage corresponding to the data to the bit line based on the page buffer control signal PB_C and the data DATA to perform a program operation. The page buffer circuit 130 may program data in the memory cell connected to the word line, which may be activated by the row decoder 120, or read the data from the memory cell.

The peripheral circuit 140 may receive a command signal CMD, the address information ADD and a control signal CTRL from an external device of the semiconductor memory device 100, for example, a controller. Further, the data DATA may be transmitted between the peripheral circuit 140 and the external device of the semiconductor memory device 100 such as the controller. The peripheral circuit 140 may output signals, for example, a row address X-add and the page buffer control signal PBC for programming the data DATA in the selected memory cell of the memory cell array 110, or for reading the data from the memory cell based on the command signal CMD, the address signal ADD and the control signal CTRL. The peripheral circuit 140 may generate various voltages required from the semiconductor memory device 100, for example, the operational voltage Vop.

Figure 2:
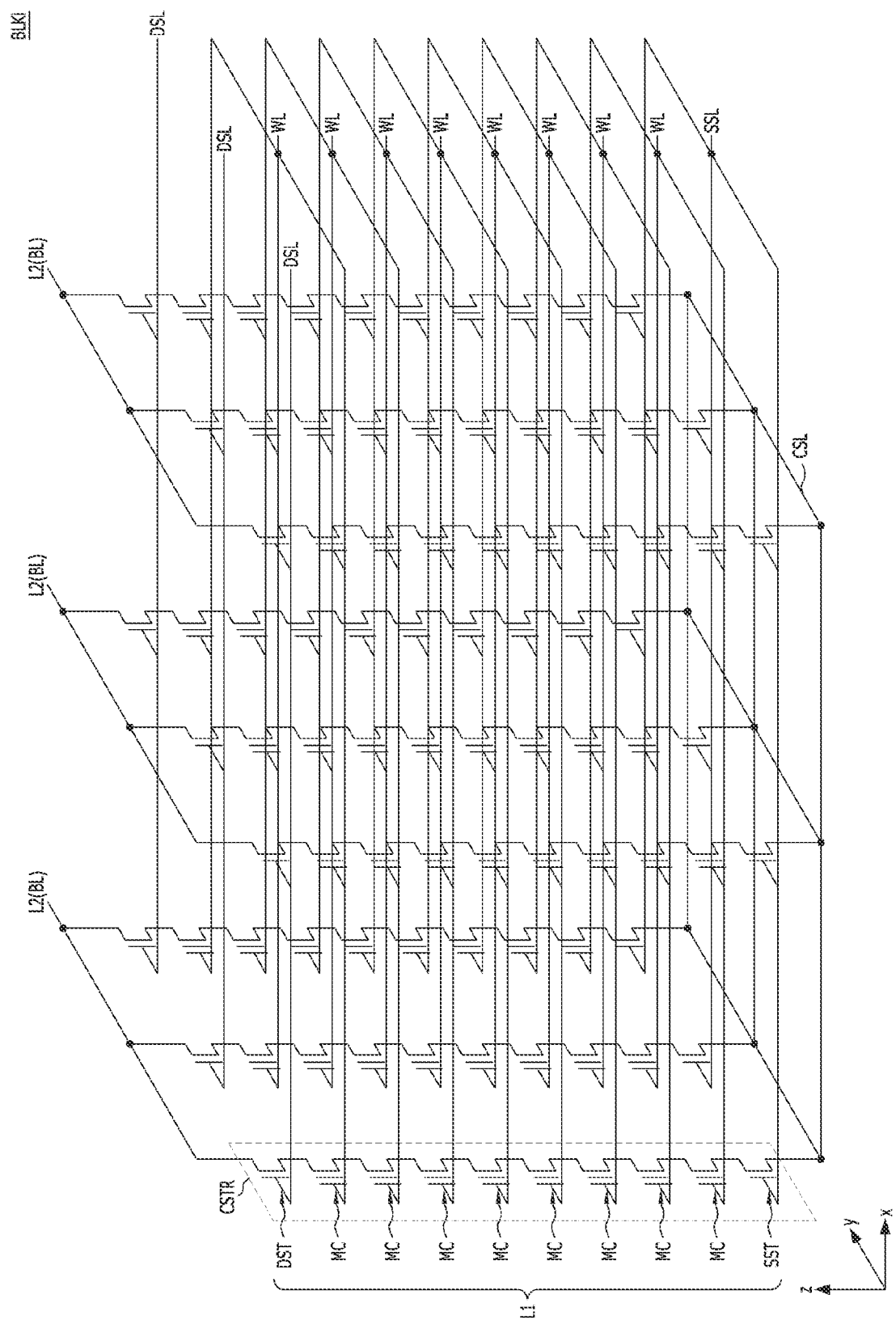
FIG. 2 is an equivalent circuit diagram illustrating a memory block in accordance with example embodiments.

FIG. 2 is an equivalent circuit diagram illustrating a memory block in accordance with example embodiments.

Referring to FIG. 2, the memory block BLKi may include the plurality of the second line structures L2 (i.e., bit lines BL), and a plurality of cell strings CSTR connected between bit lines BL and source selection lines SSL.

The second line structures L2 may be extended in parallel in a y-direction. The cell strings CSTR may be connected with each other in parallel between each of the second line structures L2 and the source selection line SSL.

Each of the cell strings CSTR may include a drain selection transistor DST, a source selection transistor SST and a plurality of memory cells MC. The drain selection transistor DST may be connected to the second line structure L2, i.e., the bit line BL. The source selection transistor SST may be connected to a common source line. The memory cells MC may be connected between the drain selection transistor DST and the source selection transistor SST. The drain selection transistor DST, the memory cells MC and the source selection transistor SST may be serially connected with each other in a z-direction.

Drain selection lines DSL, a plurality of word lines WL and a source selection line SSL may be stacked between the second line structure L2 and the common source line. The drain selection lines DSL, the word lines WL and the source selection line SSL may be extended in an x-direction. The drain selection lines DSL may be connected to a gate of the drain selection transistor DST. The source selection line SSL may be connected to a gate of the source selection transistors SST. A reference numeral CSL may be a common source line commonly connected to a source of the source selection transistors SST.

Figure 3:
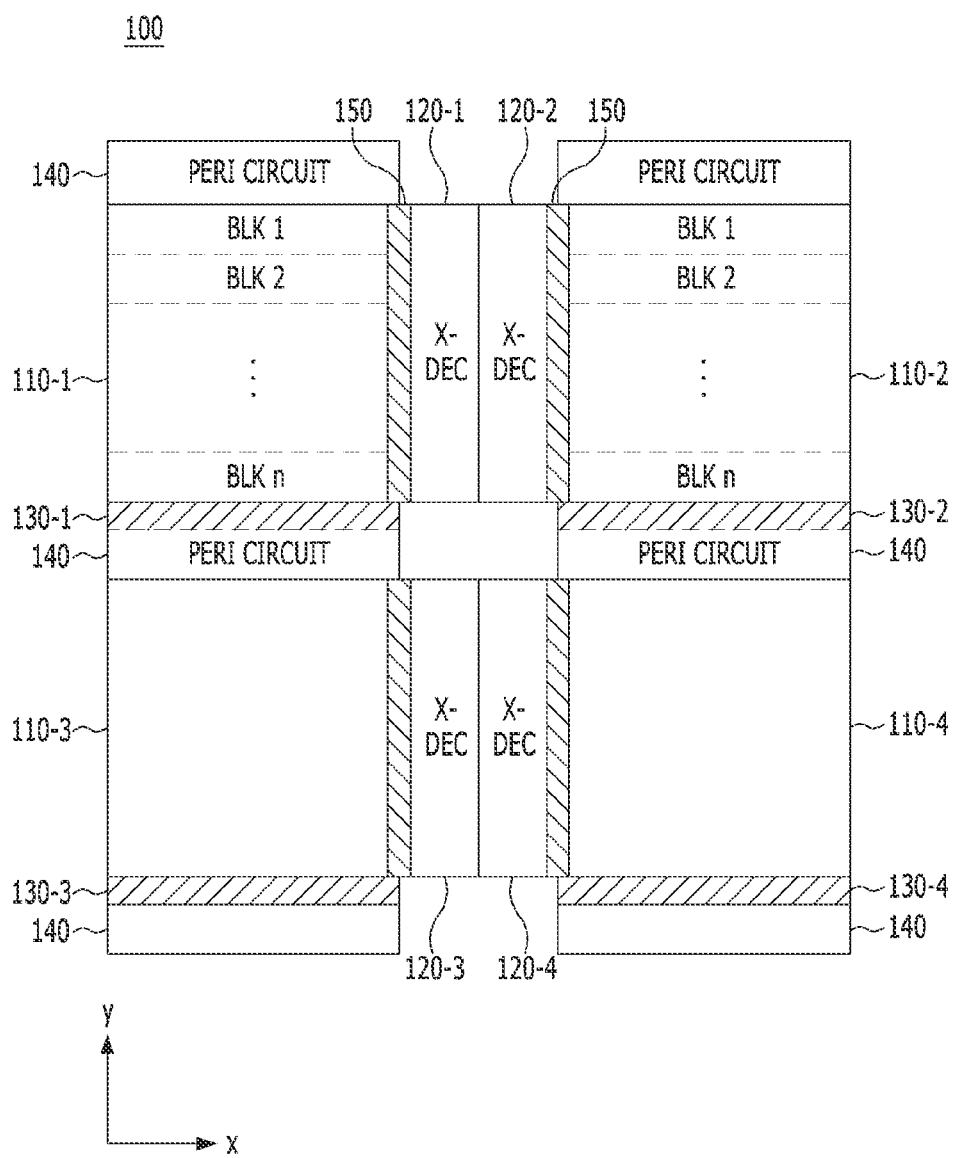
FIG. 3 is a plan view illustrating a semiconductor memory device in accordance with example embodiments.

FIG. 3 is a plan view illustrating a semiconductor memory device in accordance with example embodiments.

Referring to FIG. 3, four memory cell arrays 110-1~110-4 may be arranged on a semiconductor substrate in a matrix shape along the x-direction and the y-direction. The memory cell arrays 110-1~110-4 may correspond to a plane of a non-volatile memory device.

The row decoders 120-1~120-4 may be arranged at one edge portion of the memory cell arrays 110-1~110-4. For example, the row decoders 120-1~120-4 may be positioned at an edge portion among the edge portions of the memory cell arrays 110-1~110-4 parallel to the y-direction.

The page buffer circuits 130-1~130-4 may be arranged at the other edge portion of the memory cell arrays 110-1~110-4. For example, the page buffer circuits 130-1~130-4 may be positioned at an edge portion of the other edge portions of the memory cell arrays 110-1~110-4 parallel to the x-direction.

The memory cell arrays 110-1~110-4 may be arranged between the page buffer circuits 130-1~130-4 and the peripheral circuit 140.

In FIG. 3, the memory cell array 110-1~110-4, the row decoders 120-1~120-4, the page buffer circuits 130-1~130-4 and the peripheral circuit 140 may be positioned on a substantially same plane. Alternatively, the memory cell array 110-1~110-4, the row decoders 120-1~120-4, the page buffer circuits 130-1~130-4 and the peripheral circuit 140 may be positioned on different planes. That is, the memory cell array 110-1~110-4, the row decoders 120-1~120-4, the page buffer circuits 130-1~130-4 and the peripheral circuit 140 may have different heights from a surface of the semiconductor substrate. For example, the row decoders 120-1~120-4, the page buffer circuits 1304~130-4 and the peripheral circuit 140 may be located under the memory cell arrays 110-1~110-4.

The memory blocks BLK1~BLKn in the memory cell arrays 110-1~110-4 may be divided by a slit. A length of each of the memory blocks BLK1~BLKn may correspond to an extended length of the memory cell array 110-1~110-4 in the x-direction. In contrast, a width of the memory blocks BLKi~BLKi+n may correspond to a value of a length of the memory cell arrays 110-1~110-4 in the y-direction with respect to numbers n of the memory blocks BLKi~BLKi+n.

Further, when numbers of the memory cells in one memory block BLKi may be increased, a height of the memory block BLKi may also be increased. Thus, the memory blocks BLKi~BLKi+n divided by the slit having a narrow width may have a very high aspect ratio. Therefore, the memory blocks BLKi~BLKi+n may have a slim and long rectangular parallelepiped shape to generate a bending.

Figure 4:
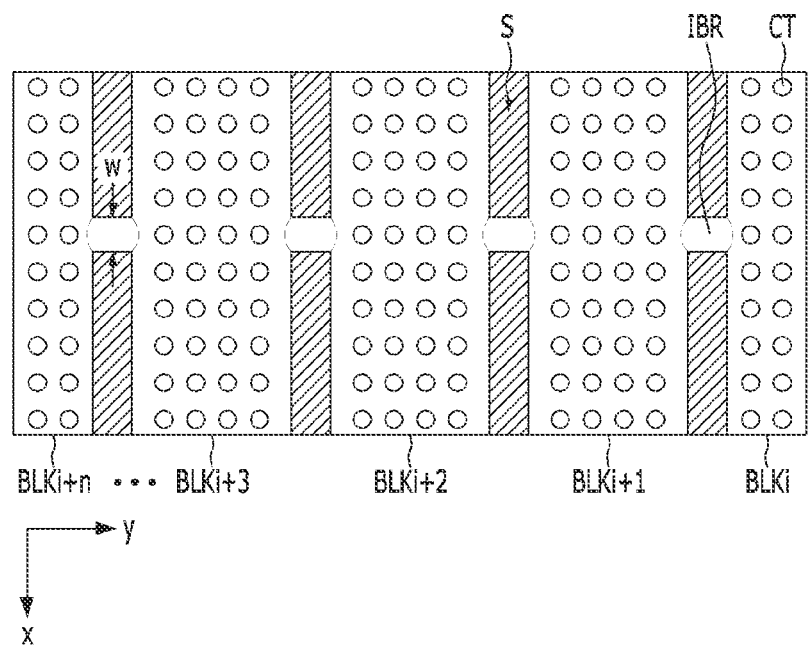
FIGS. 4 to 6 are plan views illustrating a memory block of a memory cell array in accordance with example embodiments.
Figure 5:
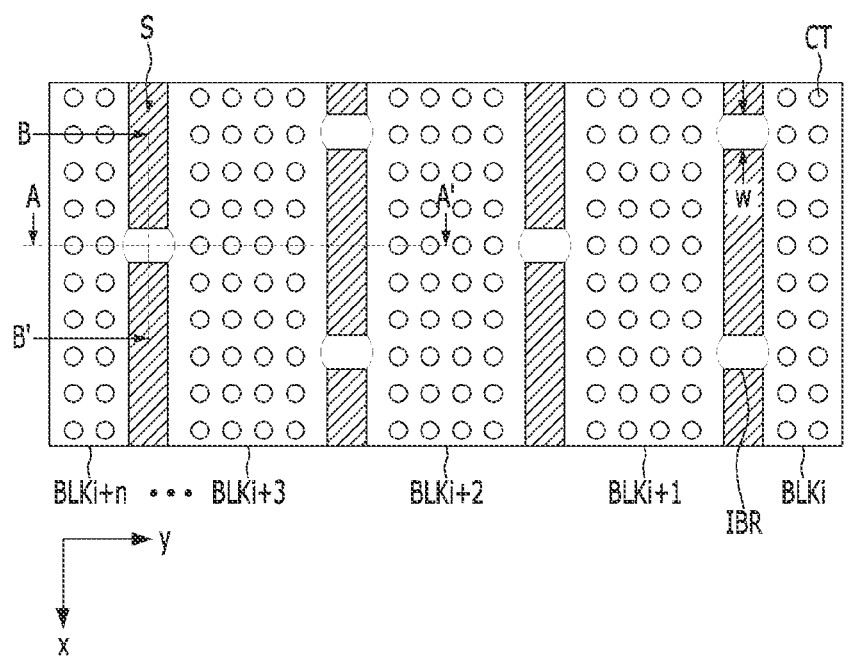
Figure 6:
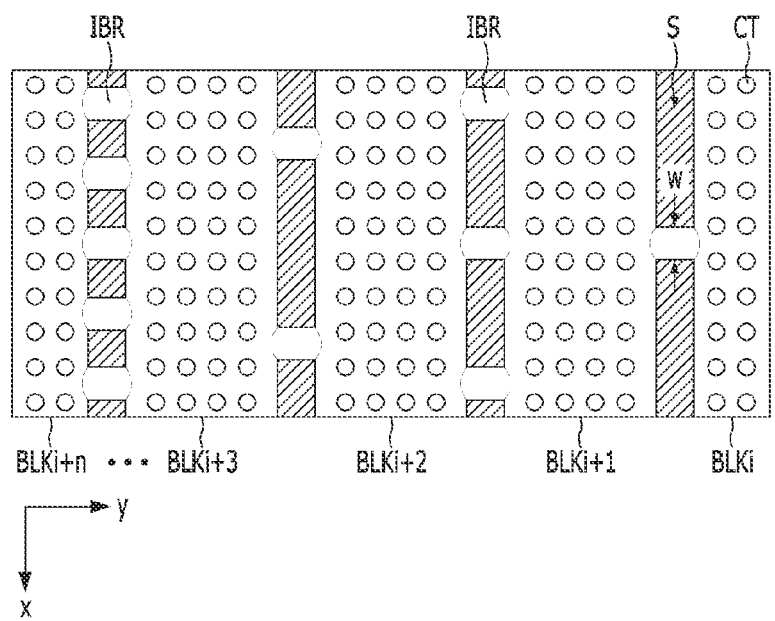

FIGS. 4 to 6 are plan views illustrating a memory block of a memory cell array in accordance with example embodiments. FIGS. 4 to 6 show memory blocks BLKi~BLKi+n among a plurality of memory blocks.

Referring to FIGS. 4 to 6, the memory blocks BLKi~BLKi+n may be divided by a slit S. A plurality of channel contacts CT may be formed in the memory blocks BLKi~BLKi+n. In example embodiments, the channel contacts CT may be arranged in a four row shape. Alternatively, the channel contacts CT may be arranged in a zigzag pattern, a honeycomb shape, etc.

In example embodiments, the slit S may be a narrow deep valley. The slit S may have a width that is much narrower than a width of the memory blocks BLKi~BLKi+n.

At least one insulation bridge IBR may be formed at the slit S to prevent a generation of a deformation such as a bending at the memory blocks BLKi~BLKi+n. For example, the insulation bridge IBR may include a plurality of insulation layers of the memory blocks BLKi~BLKi+n. The insulation bridge IBR may be extended from the insulation layer of the adjacent memory blocks BLKi~BLKi+n. The insulation bridge IBR may be configured to support the adjacent memory blocks BLKi~BLKi+n without an electrical influence between the adjacent memory blocks BLKi~BLKi+n to prevent the bending of the memory blocks BLKi~BLKi+n.

As shown in FIG. 4, the insulation bridge IBR for each slit S may be arranged so that respective insulation bridges IBR may correspond to each other. Thus, numbers of the insulation bridges IBR for each slit may be equal to each other.

Further, as shown in FIG. 5, the insulation bridges IBR for each slit S may not face each other so that the adjacent memory blocks BLKi~BLKi+n may be supported by the insulation bridges IBR in different positions. The insulation bridges IBR formed at one slit S may be spaced apart from each other by a uniform gap. Numbers of the insulation bridges IBR for each slit S may be equal to or different from each other.

As shown in FIG. 6, numbers of the insulation bridges IBR for each slit S may be different from each other. A relatively large number of the insulation bridges IBR may be arranged by a uniform gap at the slit S where the bending may be relatively frequently generated. In contrast, a relatively small number of the insulation bridges IBR may be arranged by a uniform gap at the slit S where the bending may be relatively rarely generated. Therefore, the numbers of the insulation bridges IBR for each slit S may be different from each other.

The insulation bridge IBR may have no more than a width w so as to form the insulation bridge IBR using only the insulation layer without a conductive layer. The width w of the insulation bridge IBR may be illustrated later.

FIGS. 7 to 10 are cross-sectional views illustrating a method of defining a semiconductor memory block, which has an insulation bridge taken along a line A-A' in FIG. 5. FIGS. 11 to 14 are cross-sectional views illustrating a method of defining a semiconductor memory block, which has an insulation bridge taken along a line B-B' in FIG. 5, and FIG. 15 is a plan view illustrating a bridge after forming a conductive layer for a word line in accordance with example embodiments.

Figure 7:
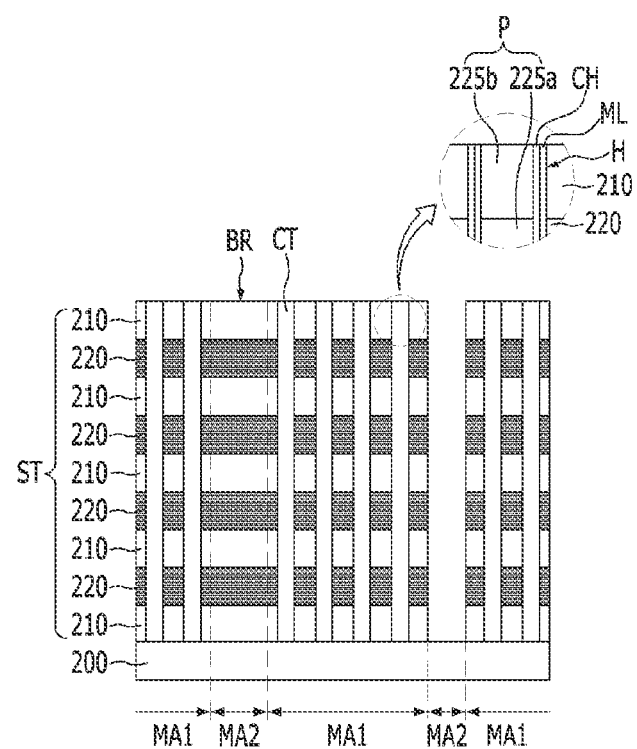
FIGS. 7 to 10 are cross-sectional views illustrating a method of defining a semiconductor memory block which has an insulation bridge taken along a line A-A' in FIG. 5.
Figure 11:
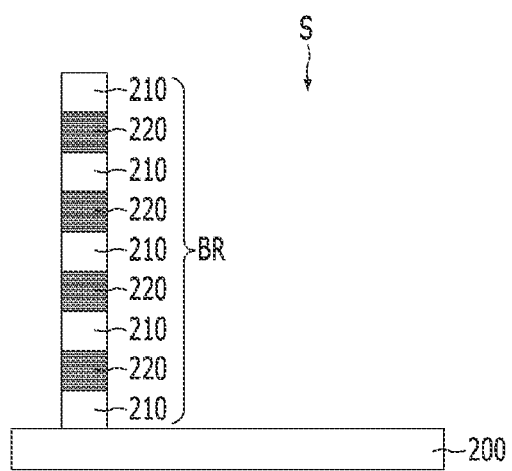
FIGS. 11 to 14 are cross-sectional views illustrating a method of defining a semiconductor memory block which has an insulation bridge taken along a line B-B' in FIG. 5.

Referring to FIGS. 7 and 11, a base layer 200 may be prepared.

In example embodiments, the base layer 200 may include a semiconductor substrate (not shown) and a control circuit layer (not shown) formed on the semiconductor substrate. The control circuit layer may include the row decoder 120, the page buffer circuit 130 and the peripheral circuit 140 as illustrated in FIG. 1.

Alternatively, the base layer 200 may include only the semiconductor substrate. The control circuit layer may be arranged at one side of the base layer 200 defined by the memory cell array 110 as illustrated in FIG. 1.

The base layer 200 where the memory cell array 110 may be formed later may be divided into a first region MA1 where a memory block may be formed later, and a second region MA2 where a slit may be formed later.

A first insulation layer 210 and a second insulation layer 220 may be alternately stacked on the base layer 200, where the memory cell array may be formed later, to form a stacked structure ST.

The first insulation layer 210 may include a material having an etching selectivity with respect to a material of the second insulation layer 220. For example, the first insulation layer 210 may include a silicon oxide layer, and the second insulation layer 220 may include a silicon nitride layer. In FIG. 7, the first insulation layer 210 and the second insulation layer 220 may be alternately stacked four times, but is not restricted within a specific number of times. For example, the first insulation layer 210 and the second insulation layer 220 may be alternately stacked dozens or hundreds of times. Further, for example, the first insulating layer may be formed on the top of the stacked structure ST.

The channel contact CT may be formed at the stacked structure ST corresponding to the first region MA1. For example, the channel contact CT may include a channel hole H formed in the stacked structure ST. The channel contact CT may include a channel pillar P configured to fill the channel hole H. The channel pillar P may include a buried insulation layer 225a configured to fill the channel hole H, and a capping pattern 225b formed on the buried insulation layer 225a. The capping pattern 225b may be a conductive pattern electrically connected to a bit line in FIG. 2. For example, the capping pattern 225b may include a polysilicon layer doped with conductive impurities.

The channel contact CT may further include a memory layer ML formed on a surface of the channel hole H, and a channel layer CH interposed between the memory layer ML and the channel pillar P. For example, the memory layer ML may include a data storage layer. The data storage layer may include a charge trapping layer such as a silicon nitride layer, a silicon layer, a phase change layer, a nano dot layer, a variable resistive layer including a metal oxide, etc. The memory layer ML may include, sequentially stacked, a tunnel insulation layer, the data storage layer and a blocking insulation layer. The channel layer CH may be formed on a surface of the memory layer ML to fill the channel hole H. The channel layer CH may include a polysilicon layer doped with conductive impurities.

In example embodiments, the first region MA1 may be a region where the memory cells may be positioned. Alternatively, the first region MA1 may be a contact region electrically connected between the memory block BLK and the row decoder. When the first region MA1 may be the contact region, a plurality of contact plugs in place of the channel contact CT may be formed in the stacked structure ST.

The stacked structure ST in the second region MA2 may be partially removed to form a slit S and a preliminary bridge BR in the second region MA2. The preliminary bridge BR may include the first insulation layer 210 and the second insulation layer 220 of the stacked structure ST.

Figure 8:
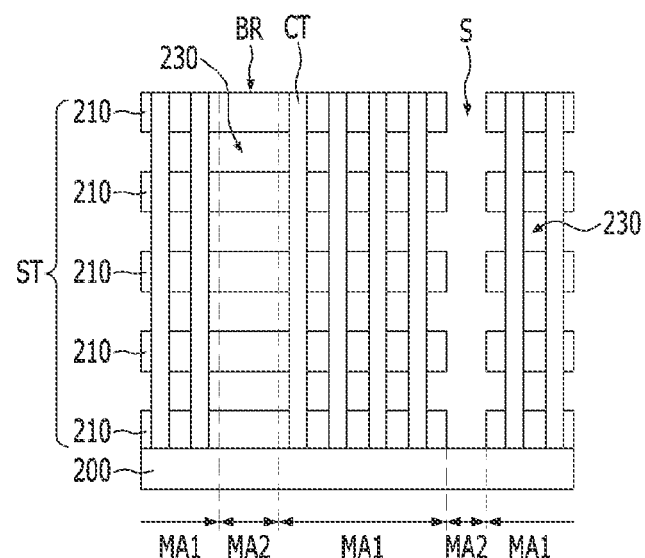
Figure 12:
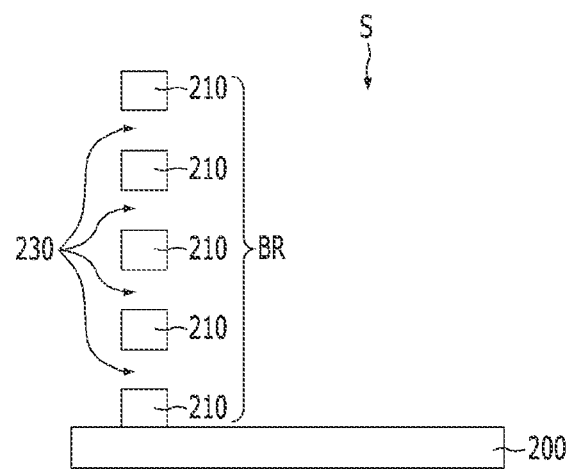

Referring to FIGS. 8 and 12, the second insulation layer 220 may be selectively removed. For example, the second insulation layer 220 may be selectively removed by a wet etching process. When the second insulation layer 220 may include the silicon nitride layer, the second insulation layer 220 may be selectively removed using a phosphoric acid solution. Thus, a space 230 may be formed in the stacked structure ST and the preliminary bridge BR.

Figure 9:
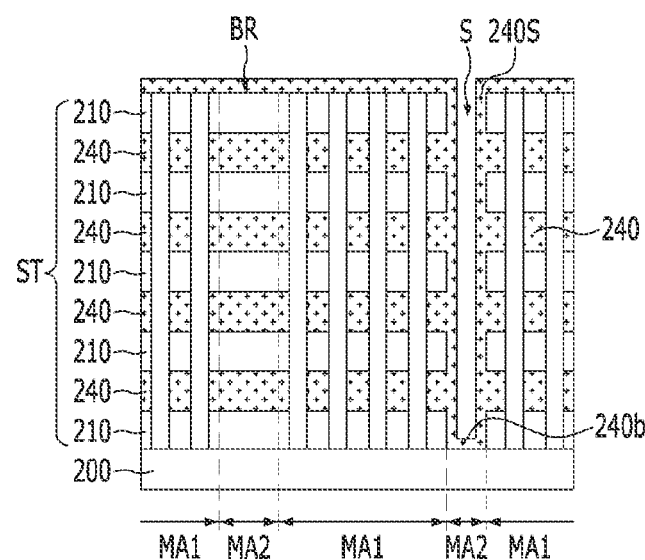
Figure 13:
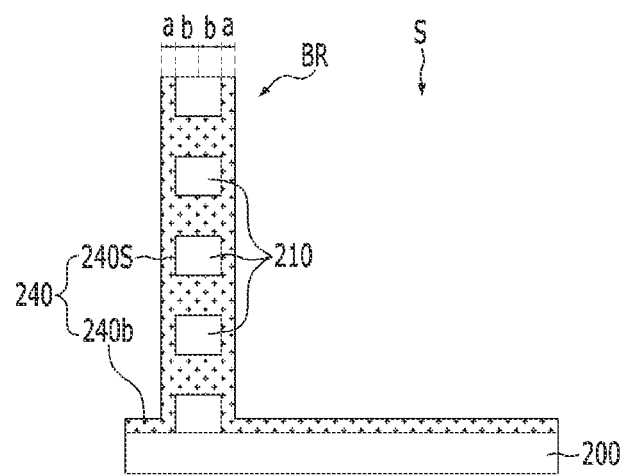

Referring to FIGS. 9, 13 and 15, the space 230 of the stacked structure ST and the preliminary bridge BR may be filled with a conductive layer 240 for a word line. The conductive layer 240 for the word line may include tungsten, which has an advantageous gap-filling characteristic and an advantageous conductive characteristic. Alternatively, the conductive layer 240 for the word line may include other conductive materials besides the tungsten. When the space 230 may be filled with the conductive layer 240 for the word line, the conductive layer 240 for the word line may be formed on a sidewall and a bottom surface of the slit S as well as in the space 230. Here, a reference numeral 240S denotes a sidewall conductive layer and a reference numeral 240b denotes a bottom conductive layer.

In order to isolate the conductive layer 240 in the stacked structure ST for each layer, the conductive layers 240S and 240b for the word line on the sidewall and the bottom surface of the slit S may be anisotropically etched. Because the width of the slit S may be very narrow, in order to completely remove the conductive layers 240S and 240b for the word line remaining on the sidewall and the bottom surface of the slit S, it may be necessary to over-etch the conductive layers 240S and 240b for the word line.

For example, as shown in FIG. 13, when the sidewall conductive layer 240S may have a width or a thickness "a", in order to completely remove the remaining conductive layer 240S, an actual etch target width may be "a+b". Thus, when the width w of the preliminary bridge BR may be set to be equal to or less than "2b", the conductive layer 240 in the preliminary bridge BR may be removed together with removing the remaining conductive layers 240S and 240b. The width w of the preliminary bridge BR may be a width in a direction parallel to a lengthwise direction of the memory block, i.e., the x-direction of the FIG. 6.

Figure 10:
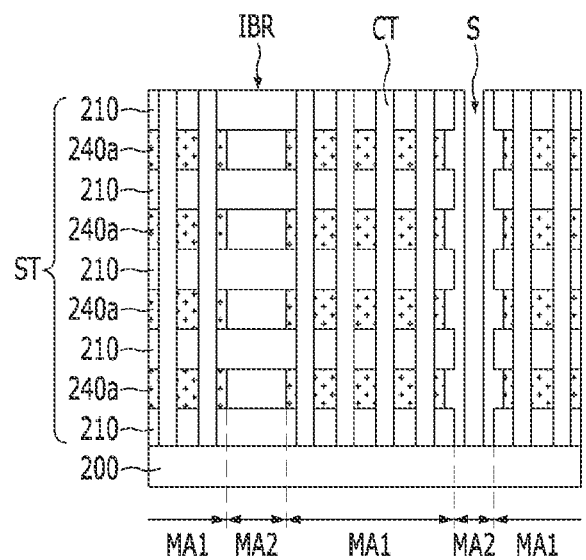
Figure 14:
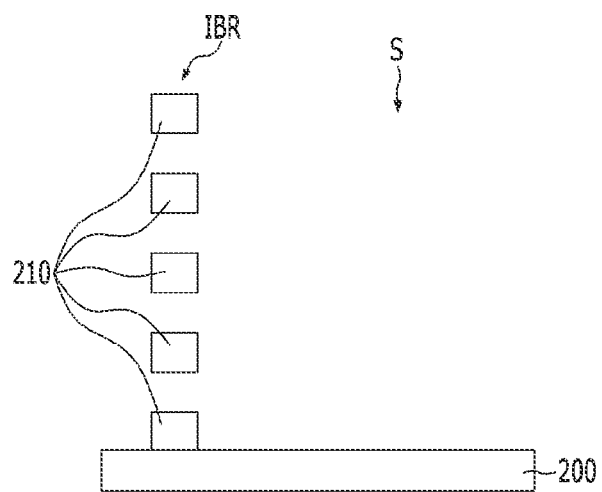
Figure 15:
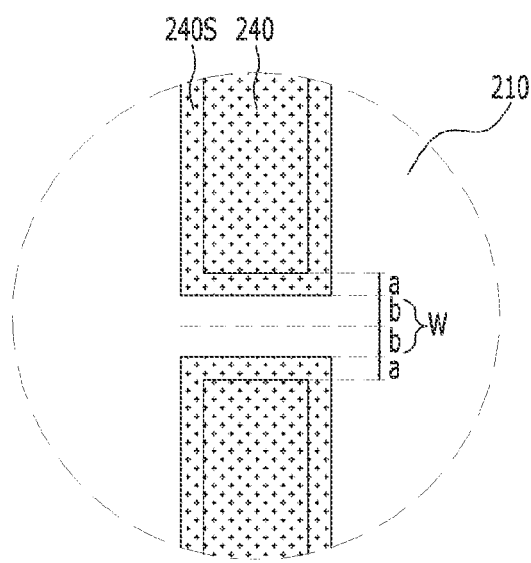
FIG. 15 is a plan view illustrating a bridge after forming a conductive layer for a word line in accordance with example embodiments.

Referring to FIGS. 10 and 14, a plurality of word lines 240a and the first insulation layer 210 may be alternately stacked in the stacked structure ST in the first region MA1. The insulation bridge IBR including the first insulation layers 210 may be formed in the slit S.

In example embodiments, the isolated conductive layers 240*a* may be named as the word lines. Alternatively, the isolated conductive layers 240*a* located at an upper region and a bottom region of the stacked structure ST may be understood as the source selection line and a drain selection line, etc.

According to example embodiments, the semiconductor memory device may include the insulation bridge at both sides of the memory blocks. Thus, the at least one insulation bridge at both sides of the memory blocks may support the memory blocks to prevent the memory blocks from leaning or being bent.

Further, the bridge between the adjacent memory blocks may include only the insulation layer so that the controls of the memory blocks may be performed without the electrical influence of the memory blocks.

Figure 16:
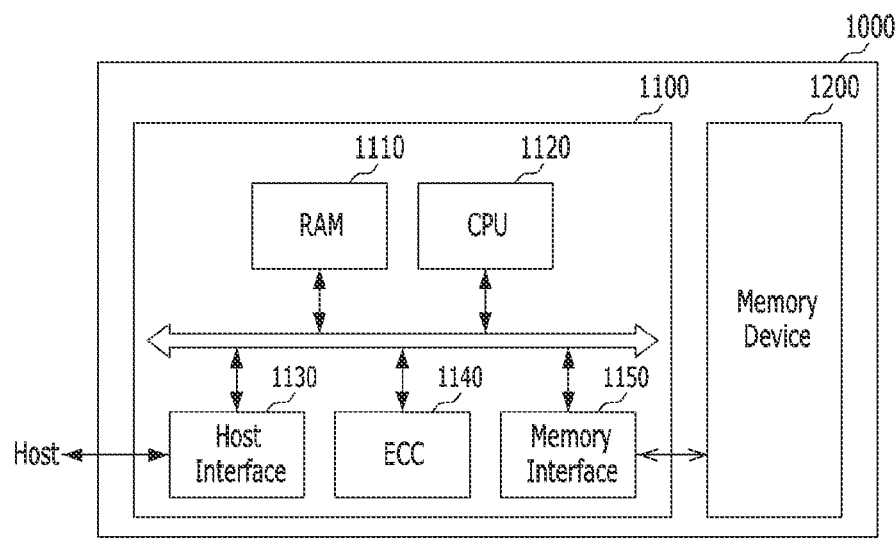
FIG. 16 is a block diagram illustrating a memory system in accordance with example embodiments.

FIG. 16 is a block diagram of a configuration of a memory system 1000 according to an embodiment of the present disclosure.

As illustrated in FIG. 16, the memory system 1000 may include a memory device 1200 and a controller 1100.

The memory device 1200 may be used to store various data types such as text, graphic, and software code. The memory device 1200 may be a non-volatile memory. The memory device 1200 may be the semiconductor device described above with reference to FIGS. 1 to 15.

The controller 1100 may be coupled to a host and the memory device 1200 and may access the memory device 1200 in response to a request from the host. For example, the controller 1100 may control read, write, and erase, and may communicate background operations of the memory device 1200.

The controller 1100 may include random access memory (RAM) 1110, a central processing unit (CPU) 1120, a host interface 1130, an error correction code (ECC) circuit 1140, and a memory interface 1150.

The RAM 1110 may function as operation memory of the CPU 1120, a cache memory between the memory device 1200 and the host, and a buffer memory between the memory device 1200 and the host. The RAM 1110 may be replaced by static random access memory (SRAM) or read only memory (ROM).

The host interface 1130 may be interfaced with the host. For example, the controller 1100 may communicate with the host through one of various interface protocols including a Universal Serial Bus (USB) protocol, a multimedia card (MMC) protocol, a peripheral component interconnection (PCI) protocol, a PCI express (PCI-E) protocol, an Advanced Technology Attachment (ATA) protocol, a Serial-ATA protocol, a Parallel-ATA protocol, a small computer small interface (SCSI) protocol, an enhanced small disk interface (ESDI) protocol, an Integrated Drive Electronics (IDE) protocol, and a private protocol.

The ECC circuit 1140 may detect and correct errors included in data read from the memory device 1200 by using error correction codes (ECCs).

The memory interface 1150 may interface with the memory device 1200. For example, the memory interface 1150 may include a NAND interface or a NOR interface.

For example, the controller 1100 may further include a buffer memory (not illustrated) configured to temporarily store data. The buffer memory may temporarily store data that is externally transferred through the host interface 1130, or temporarily store data that is transferred from the memory device 1200 through the memory interface 1150. In addition, the controller 1100 may further include a ROM for storing code data to interface with the host.

As described above, because the memory system 1000 according to an embodiment of the present disclosure may be reliably manufactured and includes the memory device 1200 having a stable structure and improved characteristics, the characteristics of the memory system 1000 may also be improved.

Figure 17:
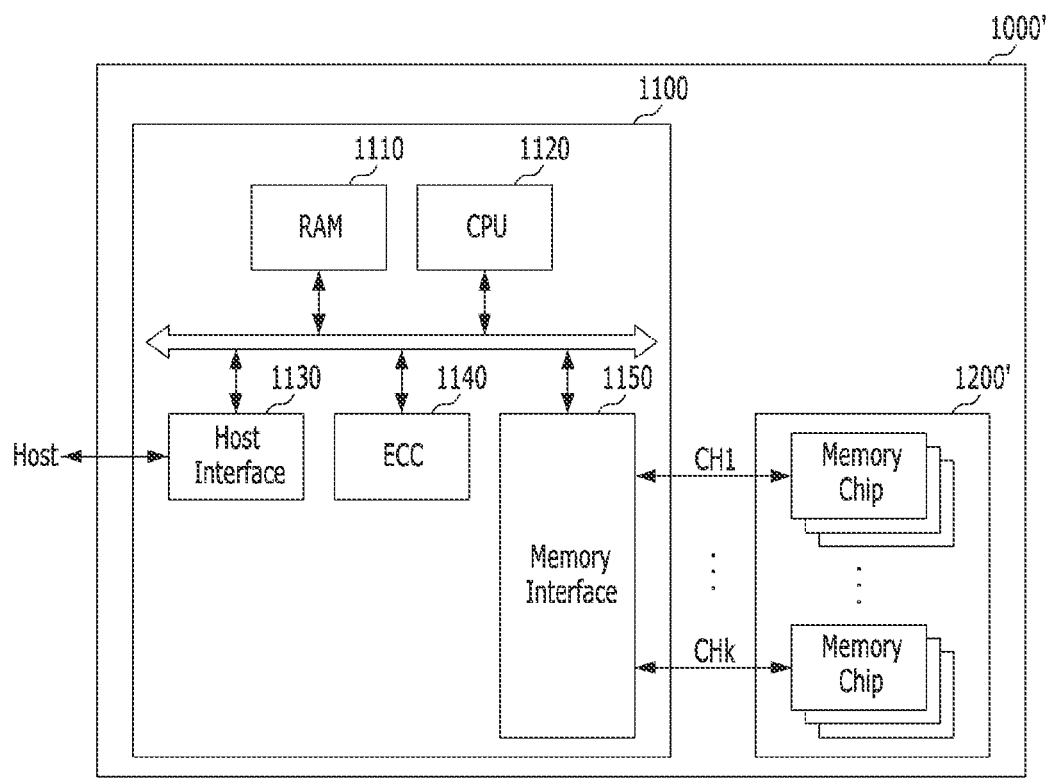
FIG. 17 is a block diagram illustrating another memory system in accordance with example embodiments.

FIG. 17 is a block diagram of a configuration of a memory system 1000' according to an embodiment of the present disclosure. Hereinafter, a description of common contents with the earlier described embodiment is omitted.

As illustrated in FIG. 17, the memory system 1000' may include a memory device 1200' and the controller 1100. In addition, the controller 1100 may include the RAM 1110, the CPU 1120, the host interface 1130, the ECC circuit 1140, and the memory interface 1150.

The memory device 1200' may be a non-volatile memory device. The memory device 1200' may be the semiconductor device described above with reference to FIGS. 1 to 15. Because the memory device 1200' may be formed and manufactured in the above-described manner, a detailed description thereof will be omitted.

In addition, the memory device 1200' may be a multi-chip package composed of a plurality of memory chips. The plurality of memory chips may be divided into a plurality of groups. The plurality of groups may communicate with the controller 1100 through first to k-th channels CH1 to CHk. In addition, memory chips, included in a single group, may be suitable for communicating with the controller 1100 through a common channel. The memory system 1000' may be modified so that a single memory chip may be coupled to a single channel.

As described above, because the memory system 1000' according to an embodiment of the present disclosure may be reliably manufactured and may include the memory device 1200' having a stable structure and improved characteristics, the characteristics of the memory system 1000' may also be improved. In addition, the data storage capacity of the memory system 1000' may be further increased by forming the memory device 1200' using a multi-chip package.

Figure 18:
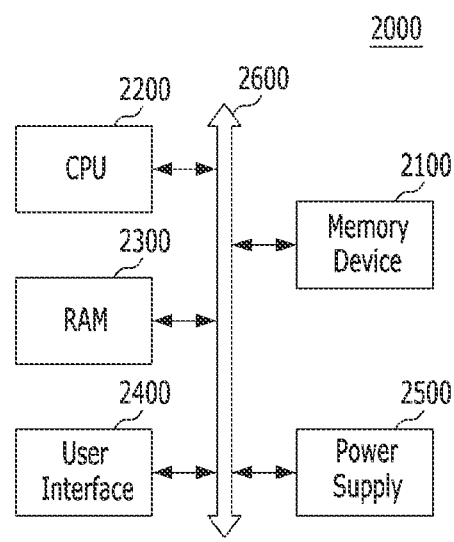
FIG. 18 is a block diagram illustrating a computing system in accordance with example embodiments.

FIG. 18 is a block diagram of a configuration of a computing system 2000 according to an embodiment of the present disclosure. Hereinafter, a description of common contents with the earlier described embodiments is omitted.

As illustrated in FIG. 18, the computing system 2000 may include a memory device 2100, a CPU 2200, random-access memory (RAM) 2300, a user interface 2400, a power supply 2500, and a system bus 2600.

The memory device 2100 may store data, which is input through the user interface 2400, and data, which is processed by the CPU 2200. In addition, the memory device 2100 may be electrically coupled to the CPU 2200, the RAM 2300, the user interface 2400 and the power supply 2500. For example, the memory device 2100 may be coupled to the system bus 2600 through a controller (not illustrated) or directly coupled to the system bus 2600. When the memory device 2100 is directly coupled to the system bus 2600, functions of the controller may be performed by the CPU 2200 and the RAM 2300.

The memory device 2100 may be a non-volatile memory. In addition, the memory device 2100 may be the semiconductor memory device described above with reference to FIGS. 1 to 19. In addition, as described above with reference to FIG. 21, the memory device 2100 may be a multi-chip package composed of a plurality of memory chips.

The computing system 2000 having the above-described configuration may be one of various components of an electronic device, such as a computer, an ultra-mobile PC (UMPC), a workstation, a net-book, personal digital assistants (PDAs), a portable computer, a web tablet, a wireless phone, a mobile phone, a smart phone, an e-book, a portable multimedia player (PMP), a portable game machine, a navigation device, a black box, a digital camera, a three-dimensional (3D) television, a digital audio recorder, a digital audio player, a digital picture recorder, a digital picture player, a digital video recorder, a digital video player, a device for transmitting/receiving information in wireless environment, one of various electronic devices for a home network, one of various electronic devices for a computer network, one of various electronic devices for a telematics network, an RFID device, and/or one of various devices for computing systems, etc.

As described above, because the computing system 2000 according to an embodiment of the present disclosure may be reliably manufactured and may include a memory device 2100 having a stable structure and improved characteristics, the characteristics of the computing system 2000 may also be improved.

Figure 19:
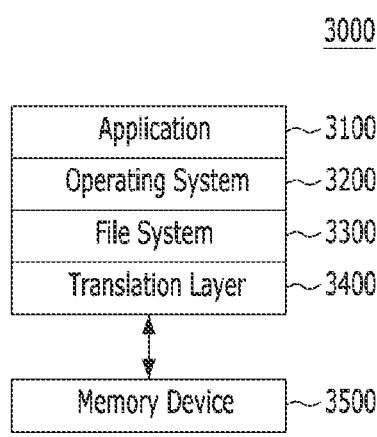
FIG. 19 is a block diagram illustrating another computing system in accordance with example embodiments.

FIG. 19 is a block diagram of a computing system 3000 according to an embodiment of the present disclosure.

As illustrated in FIG. 19, the computing system 3000 may include an application 3100, an operating system 3200, a file system 3300, and a translation layer 3400. In addition, the computing system 3000 may include a hardware layer such as a memory device 3500.

The operating system 3200 manages software and hardware resources of the computing system 3000. The operating system 3200 may control program execution of a central processing unit. The application 3100 may include various application programs executed by the computing system 3000. The application 3100 may be a utility executed by the operating system 3200.

The file system 3300 may refer to a logical structure configured to manage data and foes present in the computing system 3000. The file system 3300 may organize files or data to be stored in the memory device 3500 according to rules. The file system 3300 may be determined depending on the operating system 3100 that is used in the computing system 3000. For example, when the operating system 3100 is a Microsoft Windows-based system, the file system 3300 may be a file allocation table (FAT) or an NT file system (NTFS). In addition, when the operating system 3100 is a Unix/Linux-based system, the file system 3300 may be an extended file system (EXT), a Unix file system (UFS), or a journaling file system (JFS).

The translation layer 3400 may translate an address that is suitable for the memory device 3500 in response to a request from the file system 3300. For example, the translation layer 3400 may translate a logic address, generated by the file system 3300, into a physical address of the memory device 3500. Mapping information of the logic address and the physical address may be stored in an address translation table. For example, the translation layer 3400 may be a flash translation layer (FTL), a universal flash storage link layer (ULL), or the like.

The memory device 3500 may be a non-volatile memory. The memory device 3500 may be the semiconductor memory device described above with reference to FIGS. 1 to 15. The computing system 3000 having the above-described configuration may be divided into an operating system layer that is operated in an upper layer region and a controller layer that is operated in a lower level region. The operating system 3100, the application 3200, and the file system 3300 may be included in the operating system layer and driven by an operation memory. In addition, the translation layer 3400 may be included in the operating system layer or the controller layer.

In one embodiment, a semiconductor device may include: a plurality of memory blocks; and at least one insulating bridge connecting adjacent memory blocks among the plurality of memory blocks.

The above described embodiments of the present teachings are intended to illustrate and not to limit the present teachings. Various alternatives and equivalents are possible. The present teachings are not limited by the embodiments described herein. Nor are the present teachings limited to any specific type of semiconductor device. Other additions, subtractions, or modifications are possible in view of the present disclosure and are intended to fall within the scope of the appended claims.

What is claimed is:

1. A semiconductor memory device comprising:
    a plurality of memory blocks divided by a plurality of slits, each of the memory blocks including a plurality of conductive layers sequentially stacked and a plurality of insulation layers interposed between the plurality of conductive layers; and
    at least one insulation bridge formed in each of the slits, wherein the insulation bridge includes a plurality of insulation layers extended from the plurality of insulation layers of adjacent memory blocks, and at least one space positioned between the plurality of insulation layers constituting the bridge, respectively.

2. The semiconductor memory device of claim 1, wherein each of the memory blocks comprises:
    at least one channel structure formed in the stacked structure.

3. The semiconductor memory device of claim 1, wherein the at least one insulation bridge of each of the slits is arranged to face each other.

4. The semiconductor memory device of claim 1, wherein the at least one insulation bridge of each of the slits is arranged to be non-corresponding each other.

5. The semiconductor memory device of claim 1, wherein numbers of the insulation bridge formed in each slit correspond to each other.

6. The semiconductor memory device of claim 1, wherein numbers of the insulation bridges formed in each slit are different.

7. A semiconductor memory device comprising:
    a plurality of memory blocks including a plurality of insulation layers and a plurality of conductive layers which are alternately stacked from a bottom portion of each of the plurality of memory blocks toward an upper portion of each of the plurality of memory blocks; and
    at least one bridge located in each of slits positioned between the plurality of memory blocks,
    wherein the bridge includes a plurality of insulation layers stacked from the bottom portion to the upper portion, and
    at least one space is positioned between the plurality of insulation layers constituting the bridge, respectively.

8. The semiconductor memory device of claim 7, wherein the plurality of insulation layers of the bridge are extended from the plurality of insulation layers of adjacent memory blocks, respectively.

9. The semiconductor memory device of claim 7, wherein the at least one bridge includes a plurality of bridges spaced apart from each other.

10. The semiconductor memory device of claim 9, wherein the plurality of bridges of each of the slits are arranged to be non-corresponding to each other.

11. A semiconductor memory device comprising:
- a first stacked structure including a plurality of conductive layers stacked from a first level toward a second level higher than the first level and a plurality of insulation layers interposed between the plurality of conductive layers;
- a second stacked structure spaced apart from the first stacked structure by a first slit, the second stacked structure including a plurality of conductive layers stacked from the first level toward the second level and a plurality of insulation layers interposed between the plurality of conductive layers constituting the second stacked structure; and
- a plurality of first bridges arranged to be spaced apart from each other in the first slit, each of the first bridges including a plurality of insulation layers which connect to the plurality of insulation layers of the first stacked structure and the plurality of insulation layers of the second stacked structure, respectively; and
- at least one space positioned between the plurality of insulation layers constituting each of the first bridges, respectively.

12. The semiconductor memory device of claim 11, further comprising:
- a third stacked structure spaced apart from the second stacked structure by a second slit, the third stacked structure including a plurality of conductive layers stacked from the first level toward the second level and a plurality of insulation layers interposed between the plurality of conductive layers constituting the third stacked structure; and
- a plurality of second bridges arranged to be spaced apart from each other in the second slit, each of the second bridges including a plurality of insulation layers which connect to the plurality of insulation layers of the second stacked structure and the plurality of insulation layers of the third stacked structure, respectively.

13. The semiconductor memory device of claim 12, further comprising at least one space positioned between the plurality of insulation layers constituting each of the second bridges, respectively.

14. The semiconductor memory device of claim 12, wherein the plurality of first bridges and the plurality of second bridges are arranged to be non-corresponding to each other.

* * * * *